United States Patent
Satoh et al.

(10) Patent No.: US 10,651,143 B2
(45) Date of Patent: May 12, 2020

(54) CONDUCTIVE PASTE HAVING DILATANCY, ELECTRODE CONNECTION STRUCTURE INCLUDING THE PASTE, AND METHOD FOR PRODUCING THE STRUCTURE

(71) Applicants: SHARP KABUSHIKI KAISHA, Sakai, Osaka (JP); OSAKA UNIVERSITY, Suita-shi, Osaka (JP)

(72) Inventors: Tomotoshi Satoh, Sakai (JP); Hiroya Sato, Sakai (JP); Katsuaki Suganuma, Suita (JP); Aiji Suetake, Suita (JP); Shijo Nagao, Suita (JP); Jinting Jiu, Suita (JP); Seiichiro Kihara, Suita (JP)

(73) Assignees: SHARP KABUSHIKI KAISHA, Sakai, Osaka (JP); OSAKA UNIVERSITY, Suita-shi, Osaka (JP)

( * ) Notice: Subject to any disclaimer, the term of this patent is extended or adjusted under 35 U.S.C. 154(b) by 0 days.

(21) Appl. No.: 16/097,050

(22) PCT Filed: Apr. 28, 2017

(86) PCT No.: PCT/JP2017/017032
§ 371 (c)(1),
(2) Date: Oct. 26, 2018

(87) PCT Pub. No.: WO2017/188446
PCT Pub. Date: Nov. 2, 2017

(65) Prior Publication Data
US 2019/0157229 A1    May 23, 2019

(30) Foreign Application Priority Data
Apr. 28, 2016    (JP) .................. 2016-091804

(51) Int. Cl.
*H01L 23/00* (2006.01)
*H05K 3/32* (2006.01)
(Continued)

(52) U.S. Cl.
CPC ............ *H01L 24/13* (2013.01); *B22F 1/0055* (2013.01); *B22F 1/0074* (2013.01); *B22F 7/064* (2013.01);
(Continued)

(58) Field of Classification Search
None
See application file for complete search history.

(56) References Cited

U.S. PATENT DOCUMENTS 6,177,729 B1 * 1/2001 Benenati ................. H01L 24/11
257/737
6,317,023 B1 * 11/2001 Felten .................... H05K 1/162
174/259

(Continued)

FOREIGN PATENT DOCUMENTS

| JP | 5207281 B2 | 6/2013 |
| JP | 2015-056496 A | 3/2015 |
| JP | 2016-093830 A | 5/2016 |

OTHER PUBLICATIONS

Website of Professor Hiizu Nakanishi at Kyushu University on dilatancy, Nov. 3, 2011.

*Primary Examiner* — Bilkis Jahan
(74) *Attorney, Agent, or Firm* — ScienBiziP, P.C.

(57) ABSTRACT

Provided is an electrode like a protruding electrode that is self-standing on a substrate. A conductive paste (202) contains a conductive powder, an alcoholic liquid component, and no adhesives. The conductive powder contains conductive particles having a thickness of 0.05 μm or more and 0.1 μm or less and a representative length of 5 μm or more and 10 μm or less, the representative length being a maximum diameter in a plane perpendicular to the direction of the thickness. The weight percentage of the alcoholic liquid component relative to the conductive paste is 8% or more and 20% or less.

3 Claims, 11 Drawing Sheets

(51) Int. Cl.
  H01B 1/02 (2006.01)
  B22F 1/00 (2006.01)
  H01B 1/22 (2006.01)
  B22F 7/06 (2006.01)
  B22F 5/00 (2006.01)

(52) U.S. Cl.
  CPC ............ H01B 1/02 (2013.01); H01B 1/22 (2013.01); H01L 24/11 (2013.01); H01L 24/16 (2013.01); H01L 24/75 (2013.01); H01L 24/81 (2013.01); H05K 3/32 (2013.01); *B22F 5/00* (2013.01); *B22F 2301/255* (2013.01); *H01L 2224/0401* (2013.01); *H01L 2224/1131* (2013.01); *H01L 2224/11505* (2013.01); *H01L 2224/13139* (2013.01); *H01L 2224/16227* (2013.01); *H01L 2224/17181* (2013.01); *H01L 2224/18* (2013.01); *H01L 2224/32225* (2013.01); *H01L 2224/73204* (2013.01); *H01L 2224/75151* (2013.01); *H01L 2224/75745* (2013.01); *H01L 2224/8184* (2013.01); *H01L 2224/81192* (2013.01); *H01L 2224/81201* (2013.01); *H01L 2224/81908* (2013.01); *H01L 2224/92125* (2013.01); *H01L 2924/20105* (2013.01); *H01L 2924/20107* (2013.01)

(56) References Cited

U.S. PATENT DOCUMENTS

| | | | |
|---|---|---|---|
| 6,544,818 B2* | 4/2003 | Yagi | H01L 21/563 257/E21.503 |
| 8,610,266 B2* | 12/2013 | Chan | H01L 21/563 174/257 |
| 9,449,900 B2* | 9/2016 | Sirinorakul | H01L 23/49513 |
| 2015/0197645 A1* | 7/2015 | Inaba | H01B 1/16 252/512 |

* cited by examiner

FIG. 1

100: SEMICONDUCTOR CHIP
101, 201: ELECTRODE PAD
200: CIRCUIT BOARD
202: CONDUCTIVE PASTE

FIG. 2

— "STRINGING" PORTION

— 200 μm

— "CYLINDRICAL" PORTION

FIG. 3

1: ELECTRICAL CONNECTOR
100: SEMICONDUCTOR CHIP
101, 201: ELECTRODE PAD
200: CIRCUIT BOARD
202: CONDUCTIVE PASTE

1: ELECTRICAL CONNECTOR
100: SEMICONDUCTOR CHIP
101, 201: ELECTRODE PAD
104: SUCTION HEAD
200: CIRCUIT BOARD
202: CONDUCTIVE PASTE

202-1, 202-2: CONDUCTIVE PASTE
203-1, 203-2: NEEDLE

202-1, 202-2: CONDUCTIVE PASTE
203-1, 203-2: NEEDLE

FIG. 9

1: ELECTRICAL CONNECTOR
100: SEMICONDUCTOR CHIP
101, 201: ELECTRODE PAD
200: CIRCUIT BOARD
202: CONDUCTIVE PASTE
205: RESIN MATERIAL

FIG. 10

1A: ELECTRICAL CONNECTOR
100: SEMICONDUCTOR CHIP
101, 201: ELECTRODE PAD
200: CIRCUIT BOARD
202, 204: CONDUCTIVE PASTE
300: CONNECTOR
207: BACK ELECTRODE

| CONDUCTIVE POWDER | | SPHERICAL PARTICLES | ALCOHOLIC LIQUID COMPONENT | ADHESIVE MATERIAL | EJECTION SHAPE | BONDING |
|---|---|---|---|---|---|---|
| THICKNESS (MEDIAN VALUE) | REPRESENTATIVE LENGTH (MEDIAN VALUE) | | | | | |
| 0.08 μm | 8 μm | ABSENT | 5% | ABSENT | POOR | POOR |
| ↑ | ↑ | ↑ | 8% | ↑ | GOOD | GOOD |
| ↑ | ↑ | ↑ | 10% | ↑ | GOOD | GOOD |
| ↑ | ↑ | ↑ | 15% | ↑ | GOOD | GOOD |
| ↑ | ↑ | ↑ | 20% | ↑ | GOOD | GOOD |
| ↑ | ↑ | ↑ | 30% | ↑ | GOOD | POOR |
| ↑ | ↑ | ↑ | 40% | ↑ | GOOD | POOR |
| 0.05 μm | 5 μm | ↑ | 5% | ↑ | POOR | POOR |
| ↑ | ↑ | ↑ | 8% | ↑ | GOOD | GOOD |
| ↑ | ↑ | ↑ | 10% | ↑ | GOOD | GOOD |
| ↑ | ↑ | ↑ | 20% | ↑ | GOOD | GOOD |
| ↑ | ↑ | ↑ | 30% | ↑ | GOOD | POOR |
| ↑ | 10 μm | ↑ | 5% | ↑ | POOR | POOR |
| ↑ | ↑ | ↑ | 8% | ↑ | GOOD | GOOD |
| ↑ | ↑ | ↑ | 10% | ↑ | GOOD | GOOD |
| ↑ | ↑ | ↑ | 20% | ↑ | GOOD | GOOD |
| ↑ | ↑ | ↑ | 30% | ↑ | GOOD | POOR |
| 0.1 μm | 5 μm | ↑ | 5% | ↑ | POOR | POOR |
| ↑ | ↑ | ↑ | 8% | ↑ | GOOD | GOOD |
| ↑ | ↑ | ↑ | 10% | ↑ | GOOD | GOOD |
| ↑ | ↑ | ↑ | 20% | ↑ | GOOD | GOOD |
| ↑ | ↑ | ↑ | 30% | ↑ | GOOD | POOR |
| ↑ | 10 μm | ↑ | 5% | ↑ | POOR | POOR |
| ↑ | ↑ | ↑ | 8% | ↑ | GOOD | GOOD |
| ↑ | ↑ | ↑ | 10% | ↑ | GOOD | GOOD |
| ↑ | ↑ | ↑ | 20% | ↑ | GOOD | GOOD |
| ↑ | ↑ | ↑ | 30% | ↑ | GOOD | POOR |
| 0.08 μm | 8 μm | PRESENT | 10% | ↑ | GOOD | GOOD |
| 0.05 μm | 5 μm | ↑ | 10% | ↑ | GOOD | GOOD |
| ↑ | 10 μm | ↑ | 10% | ↑ | GOOD | GOOD |
| 0.1 μm | 5 μm | ↑ | 10% | ↑ | GOOD | GOOD |
| ↑ | 10 μm | ↑ | 10% | ↑ | GOOD | GOOD |
| 0.08 μm | 8 μm | ABSENT | 5%–40% | PRESENT | GOOD | POOR |
| 0.03 μm | ↑ | ↑ | 5%–40% | ABSENT | POOR | POOR |
| 0.2 μm | ↑ | ↑ | 5%–40% | ↑ | GOOD | POOR |

FIG. 15

CONDUCTIVE PASTE HAVING DILATANCY, ELECTRODE CONNECTION STRUCTURE INCLUDING THE PASTE, AND METHOD FOR PRODUCING THE STRUCTURE

TECHNICAL FIELD

The present invention relates to a flip-chip bonding structure and a method for achieving the structure. In particular, the invention relates to a conductive paste having dilatancy, an electrical connection structure including the paste, and a method for producing the structure.

BACKGROUND ART

Many attempts have been made to use conductive pastes for flip-chip bonding. In particular, in joining using a sintering-type conductive paste containing submicron conductive fine particles, temperature properties and mechanical properties comparable to those of bulk silver, which is a conductive material, are provided after curing, and thus the joint can withstand high temperatures. Hence, this technique has the potential to be used for joints of devices that operate at high temperatures and thus has recently been attracting attention.

CITATION LIST

Patent Literature

PTL 1: Japanese Patent No. 5207281
PTL 2: Japanese Unexamined Patent Application Publication No. 2015-56496

Non Patent Literature http://www.stat.phys.kyushu-u.ac.jp/~nakanisi/Physics/Dilatancy/

SUMMARY OF INVENTION

Technical Problem

The sintering-type silver paste disclosed in PTL 1 is a dispersion of two types of silver particles in a binder containing no adhesives and has post-cure properties similar to those of bulk silver. The disclosure of PTL 1 includes application to a wide area, mounting of an electronic device, and curing under pressure. The disclosure of PTL 1 includes application to a wide area and hence no techniques for electrode connection of an electronic device.

PTL 2 discloses a method for connecting an electrode on an electronic device and an electrode on a circuit board to each other. The method for connecting an electrode on an electronic device and an electrode on a circuit board to each other disclosed in PTL 2 will be described with reference to FIG. 12.

Figure 12:
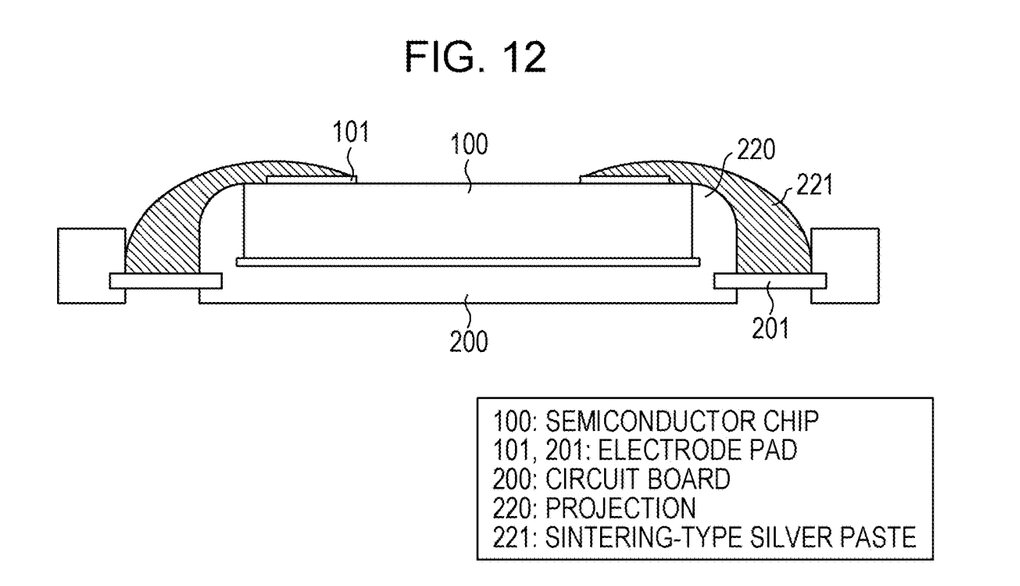
FIG. 12 illustrates a conventional electrical connector.

In FIG. 12, 100 denotes a semiconductor chip, 101 denotes an electrode pad on the semiconductor chip, 200 denotes a circuit board, and 201 denotes an electrode pad on the circuit board. On the circuit board 200, a projection 220 is formed so as to cover the sides of the semiconductor chip 100, and a sintering-type silver paste 221 is disposed so as to extend from the electrode pad 101 to the electrode pad 201 along the surface of the projection 220.

The projection 220 is provided to keep the sintering-type silver paste 221 from breaking midway because the sintering-type silver paste 221 has fluidity. The sintering-type silver paste 221 needs to extend along the circuit board 200 to be kept from breaking midway, and the degree of freedom is limited. In this structure, the sectional shape of the sintering-type silver paste 221 is inconstant, and excellent electrically conductive and thermally conductive properties of the material itself cannot be fully exhibited.

The present invention has been made in view of the following problems and aims to provide a conductive paste that can form an electrode like a self-standing protruding electrode and to connect electrodes together by using the conductive paste.

Solution to Problem

To solve the problems described above, a conductive paste according to one aspect of the present invention is a conductive paste usable for electrical connection between a substrate and an electronic component mounted on the substrate. The conductive paste contains a conductive powder, an alcoholic liquid component, and no adhesives. The conductive powder contains conductive particles having a thickness of 0.05 µm or more and 0.1 µm or less and a representative length of 5 µm or more and 10 µm or less, the representative length being a maximum diameter in a plane perpendicular to a direction of the thickness, and the weight percentage of the alcoholic liquid component in the conductive paste is 8% or more and 20% or less.

Advantageous Effects of Invention

One aspect of the present invention has the effect that an electrode like a self-standing protruding electrode can be provided and that electrodes are connected together by using a conductive paste.

DESCRIPTION OF EMBODIMENTS

Embodiment 1

(Outline of Conductive Paste and Electrical Conductor)

An embodiment of the present invention will be described below in detail. In an electrical connector according to this embodiment, a conductive paste with high shape retention is used for electrical connection between a substrate and an electronic component mounted on the substrate. The conductive paste is ejected from a dispenser and sintered while maintaining its shape, whereby an electrical connector is provided. Specifically, a conductive paste having dilatancy is used.

Dilatancy is a property that a non-Newtonian fluid has, i.e., a property in which viscosity increases with increasing shear rate. This property is often manifested by small particles mixed with a liquid. For example, a weight put on dry sand sinks, but a weight put on sand wet with water only sinks a little and does not sink further. This can probably be explained as follows: the shear rate increases due to deformation, and when the shear rate at which dilatancy is manifested is reached, the deformation appears to have stopped due to increased viscosity. Furthermore, there is a characteristic phenomenon in which sand at deformed part looks dry. When sand in a nearly close-packed state is deformed, interparticle gaps expand by contraries, and water moves into the gaps, as a result of which the deformed part becomes dry (see NPL 1).

A conductive paste made of a material having such dilatant properties is ejected from a dispenser or the like onto a desired electrode on a circuit board, thereby forming a pointy-shaped portion at the upper part of an uncured conductive paste having a desired shape.

Thereafter, a device electrode is aligned with the pointy-shaped portion of the conductive paste, and the device electrode is pressed against the pointy-shaped portion of the conductive paste. When the pointy-shaped portion of the conductive paste is pressed, the shear rate increases as the conductive paste is deformed, as a result of which the shear rate at which the conductive paste manifests dilatancy is reached, and reaction force against the deformation starts to increase. This is exactly analogous to the phenomenon in which wet sand, after sinking (deforming) a little, abruptly becomes less likely to deform due to dilatancy.

It is advantageous for a sintering-type conductive paste that deformed part becomes dry due to dilatancy. A local decrease in the amount of binder makes conductive particles come into contact with one another, and as a result, linkage due to the intermolecular force between the particles occurs locally. This probably creates a temporarily joined state.

Figure 13:
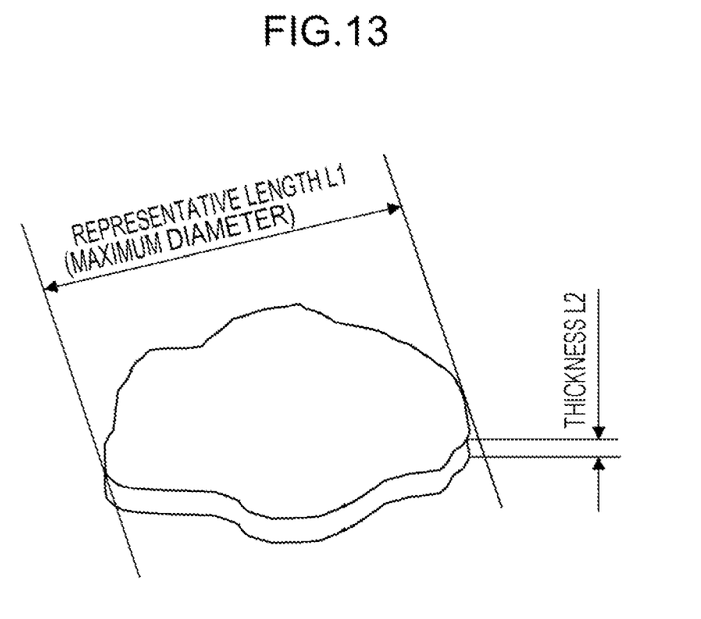
FIG. 13 is a perspective view showing the shape of a conductive powder according to Embodiment 1 of the present invention.

The shape of a conductive powder, which is the point of dilatancy, will be described with reference to FIG. 13. FIG. 13 is a perspective view showing the shape of a conductive powder according to Embodiment 1 of the present invention.

As shown in FIG. 13, one conductive powder has a relatively uniform thickness in a thickness L2 direction. The conductive powder has a random shape in a plane perpendicular to the thickness direction. The length of a maximum diameter (width) of the conductive powder is referred to as a representative length L1 in the direction perpendicular to the thickness direction.

The representative length L1 and the thickness L2 of the conductive powder each have a distribution, and hence they are numerically expressed as median values in the following description. The thickness L2 of the conductive powder is about 0.05 μm or more and 0.1 μm or less, and the representative length L1 of the conductive powder is about 5 um or more and 10 μm or less.

Figure 14:
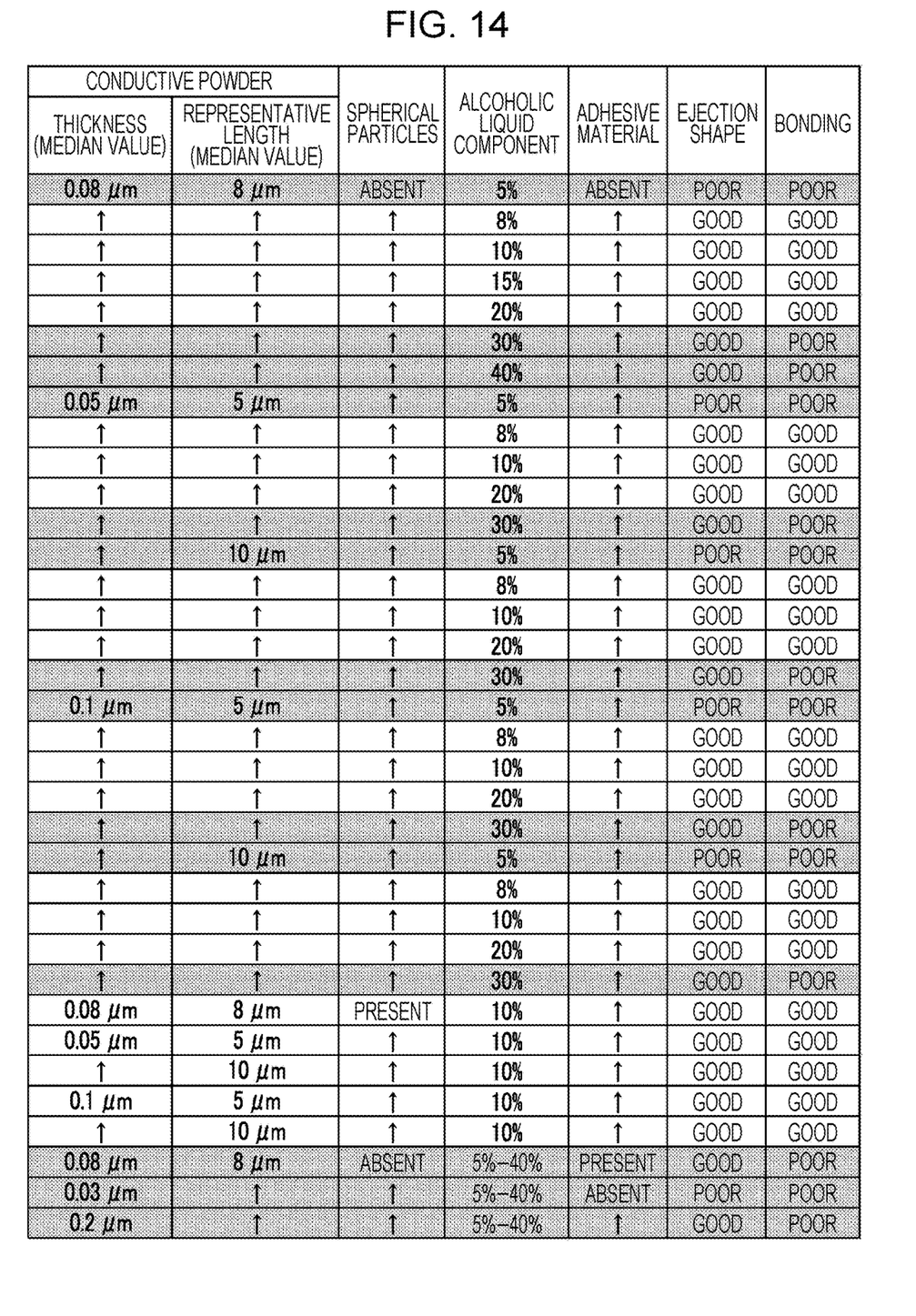
FIG. 14 is a table showing the results of preparatory experiments according to Embodiment 1 of the present invention.

FIG. 14 is a table showing the results of preparatory experiments on conductive powders contained in the conductive paste and the electrical conductor according to Embodiment 1 of the present invention.

As described above, a maximum diameter length in a plane perpendicular to the thickness direction of the conductive powder is referred to as a representative length.

Using a conductive powder having a representative length of 8 μm and a thickness of 0.08 μm, experiments for evaluating the state of ejection from a dispenser and the results of bonding were performed while varying the amount of alcoholic liquid component, the presence of spherical particles mixed together, and the presence of an adhesive binder. Ethylene glycol was used as an alcoholic liquid component, and an epoxy resin was used as an adhesive material. An alcoholic liquid component in an amount of 5% resulted in excessively high viscosity and unsuccessful ejection. An alcoholic liquid component in an amount of 40% resulted in low viscosity and unsuccessful shape retention. An alcoholic liquid component in an amount of 30% resulted in an acceptable ejection, but the ejected conductive paste collapsed before dilatancy was manifested. When the amount of alcoholic liquid component was 8% or more and 20% or less, good ejection and bonding were achieved.

A mixture with a spherical conductive powder having a diameter approximately equal to the thickness of the conductive powder also had no problems with both ejection and bonding.

Furthermore, although FIG. 14 shows the ejection shape and bonding properties in the cases where spherical particles were present, the amount of alcoholic component was 10%, and the conductive powder had thicknesses of 0.05 μm or more and 0.1 μm or less and representative lengths of 5 μm or more and 10 μm or less, it has been confirmed that also when the amount of alcoholic component was 8% or more and 20% or less, the ejection shape and bonding properties were similarly excellent.

A mixture with an adhesive material was successfully ejected to form an ejection shape but collapsed when bonding was performed. This is probably because dilatancy was not manifested.

Flat particles (i) having a representative length of 5 μm and a thickness of 0.1 μm and flat particles (ii) having a representative length of 10 μm and a thickness of 0.05 μm, the particles being conductive powders, both allowed ejection and bonding with no problems.

However, when a conductive powder having a thickness of 0.03 μm was used, the material was highly activated, and protective coating had to be reinforced. Thus, although an acceptable ejection shape was formed, dilatancy was not manifested, and collapse occurred during bonding.

Also when a conductive powder having a thickness of 0.2 µm was used, dilatancy was not manifested, and collapse occurred during bonding.

It turned out that conductive pastes formed by dispersing a conductive powder having a thickness of 0.05 µm or more and 0.1 µm or less and a representative length of 5 µm to 10 µm in an alcoholic liquid component containing no adhesives were good. The amount of alcoholic liquid component is preferably 8% or more and 20% or less by weight.

The thickness of the conductive powder is preferably 0.1 µm or less because conductive powders having a submicron thickness show strong linkages due to intermolecular force.

However, conductive powders having a thickness of less than 0.05 µm, to provide a stable conductive paste, require an increased amount of solvent or the use of an intermolecular-force-reducing material on the particle surface. The increased amount of solvent resulted in excessively low viscosity and hence no formation of an ejection shape, and the intermolecular-force-reducing material on the particle surface inhibited the manifestation of dilatancy, thus failing to provide a preferred material. Thus, the thickness of the conductive powder is preferably 0.05 µm or more.

The alcoholic liquid component alone is used as a solution component for dissolving the conductive powder. When a polymeric material such as an adhesive was added, the manifestation of dilatancy was inhibited as expected.

In this embodiment, a conductive paste made of silver particles (conductive powder) having a thickness of 0.08 µm and a representative length of 8 (the ratio of the thickness to the representative length is 100) and ethylene glycol at a weight percentage of 10% is used. The conductive paste is ejected from a dispenser and then cured (sintered) as ejected. The sintering will be completed while the ejection shape is almost maintained.

The sintered silver paste shows good electrical conductivity. Furthermore, a mixture with spherical particles having a diameter of 0.1 µm approximately equal to their thickness shows better electrical conductivity due to the presence of the spherical particles at interfaces between joined flat particles. As compared to 2.1 µΩ·cm for metal silver, the value of electrical conductivity of the mixture is 3.9 to 7.8 µΩ·cm, which is sufficiently higher than those of solder and the like. The same is true of thermal conductivity.

Figure 2:
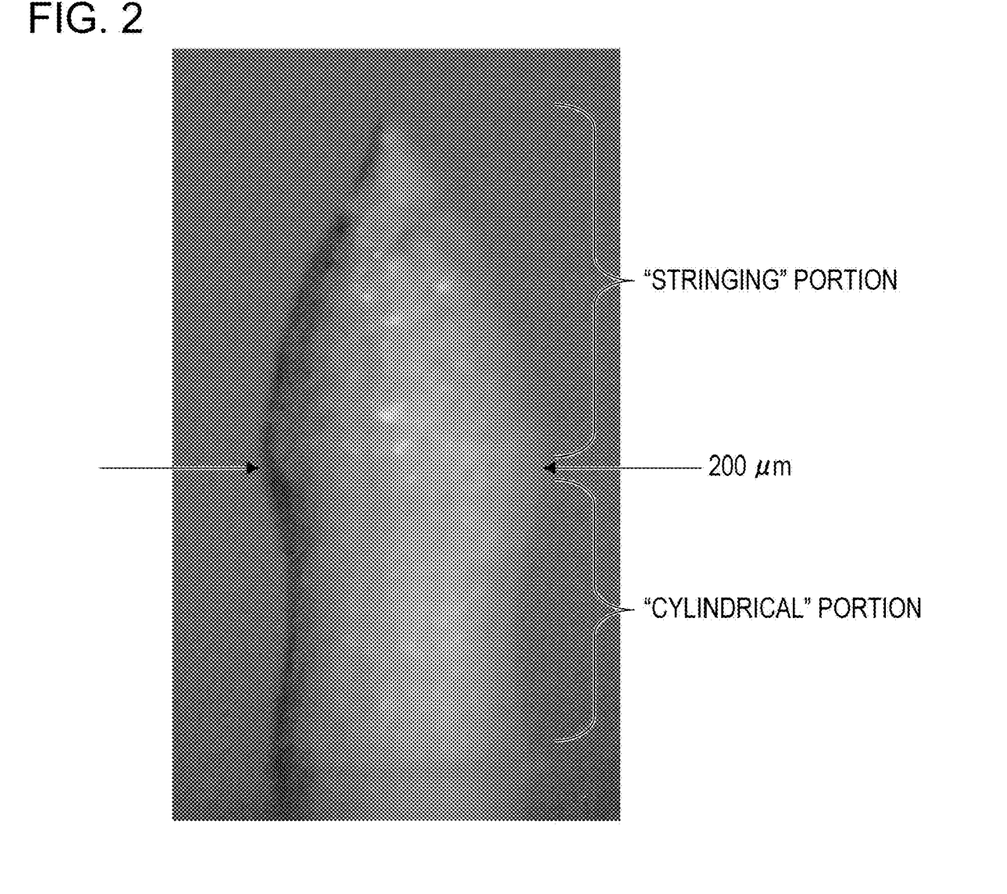
FIG. 2 shows a column of a conductive paste according to Embodiment 1 formed by dispensing.

Using the sintering-type silver paste, columns of the sintering-type silver paste are formed on an electrode pad on a circuit board with a dispenser (see FIG. 2).

Figure 11:
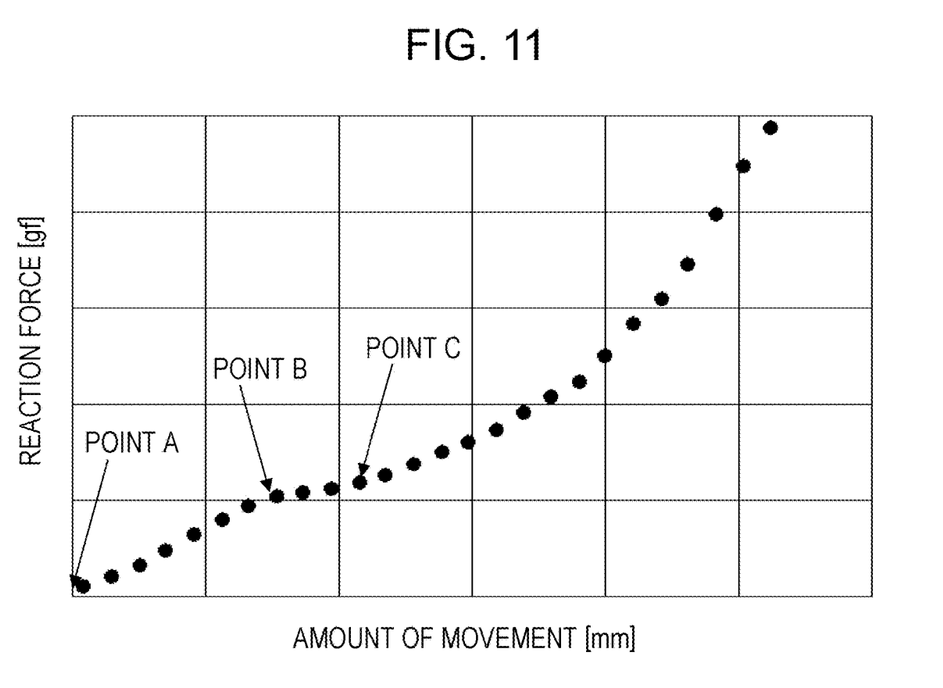
FIG. 11 illustrates how the load (reaction force) behaves during mounting with a flip-chip bonder.

Subsequently, a semiconductor chip is fixed by suction to a chip-fixing unit (bonding tool) of a flip-chip bonder. Electrode pads on the semiconductor chip and pads on the circuit board are aligned with each other, and the distance between the semiconductor chip and the circuit board is shortened until a desired load (reaction force) is reached. The fixation at the chip-fixing unit is released so that the paste is fixed to the circuit board only by the self-weight of the semiconductor chip. The reaction force of the chip monitored by the flip-chip bonder behaves as shown in FIG. 11. As the flip-chip bonder is pushed down to the circuit board while maintaining the moving speed of the semiconductor chip at a predetermined constant speed, a point (point C in FIG. 11) appears where the reaction force is increased by the manifestation of dilatancy. The fixation of the chip is released at this point so that the paste is fixed by the self-weight of the chip.

Figure 15:
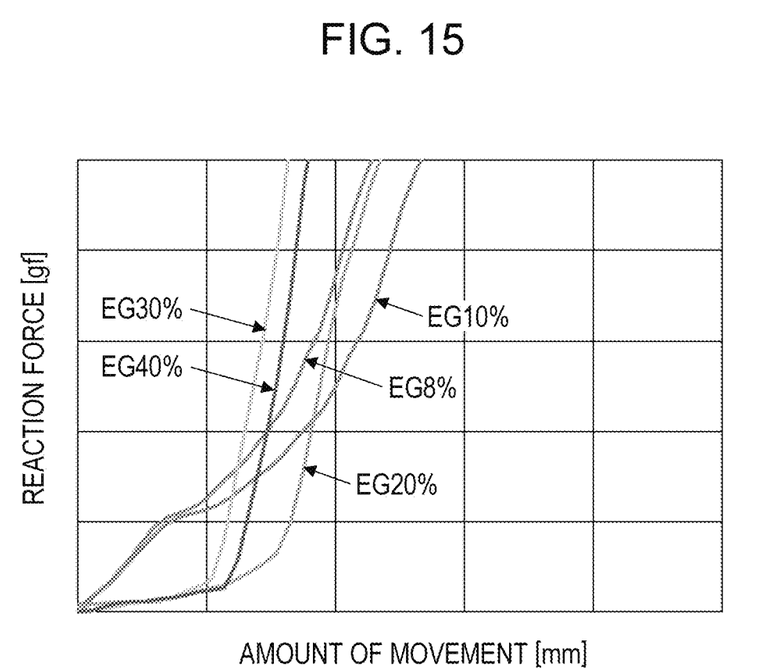
FIG. 15 is a graph show ring load (reaction force) changes during mounting with a flip-chip bonder with various alcoholic liquid components.

FIG. 15 is a graph showing load (reaction force) changes during mounting with a flip-chip bonder with various alcoholic liquid components. EG10% to EG40% shown in FIG. 15 each represent the weight percentage of an alcoholic liquid component (the weight percentage of ethylene glycol).

EG8%, EG10%, and EG20% are examples in which dilatancy was manifested to achieve successful bonding.

EG30% and EG40% are examples in which dilatancy was not manifested and collapse occurred during bonding.

In terms of the change in reaction force, EG20%, EG30%, and EG40% behave in a similar manner, but regarding the point where the reaction force starts to increase, the increases in EG30% and EG40% were due to the complete collapse of the conductive paste, whereas the increase in EG20% was due to the stop of deformation that accompanied the manifestation of dilatancy. Also in EG8% and EG10%, the points where the reaction force started to increase again were due to the stop of deformation that accompanied the manifestation of dilatancy.

EG8%, EG10%, and EG20% behave in slightly different ways. In EG20%, an elongated stringing portion was formed due to low viscosity, and the deformation to collapse the stringing portion took a longer time.

These results show that when a conductive paste having dilatancy is used, presetting a load at which deformation is stopped by dilatancy enables bonding by load control.

By sintering the sintering-type silver paste thereafter, a connection between the semiconductor chip and the circuit board through the sintering-type silver paste alone can be achieved.

By doing this, the paste is sintered while maintaining the shape as ejected from a dispenser, and an electrical connection portion having the same shape as in pillar connection is formed.

It should be noted that a thin film may be formed on the surface of a chip electrode on the semiconductor chip or the surface of the electrode pad on the circuit board in order, for example, to prevent oxidation, but the description thereof is omitted for brevity. The presence or absence of such a thin film has little effect.

(Main Advantages)

In the following description, the conductive paste that connects the semiconductor chip and the circuit board to each other may be referred to as a connection portion (electrical connection portion).

The connection portion produced in the above-described manner contains no adhesives and is constituted by sintered silver paste alone, and thus is excellent in both electrical conductivity and thermal conductivity and retains its mechanical properties at high temperatures.

The shape retention of the sintering-type silver paste enables an electrode like a protruding electrode not extending along the circuit board. In addition, the spacing between adjacent electrodes is constant, which provides good insulation between the electrodes.

The sintered structure having many microvoids characteristic of sintering-type silver paste is superior to pillars that allow deformation and whose stress relaxation mechanisms are all made of metals.

In addition, although the binder added needs to be volatilized in sintering the sintering-type silver paste, the sintering-type silver paste is divided into a large number of masses having spaces therebetween and hence having a larger surface area. Thus, the volatilization of the binder is completed in a shorter time, leading to a secondary effect that the sintering is completed in a shorter time.

Experimental Example

An experimental example according to Embodiment 1 of the present invention will be described with reference to FIG. 1 to FIG. 11.

Figure 1:
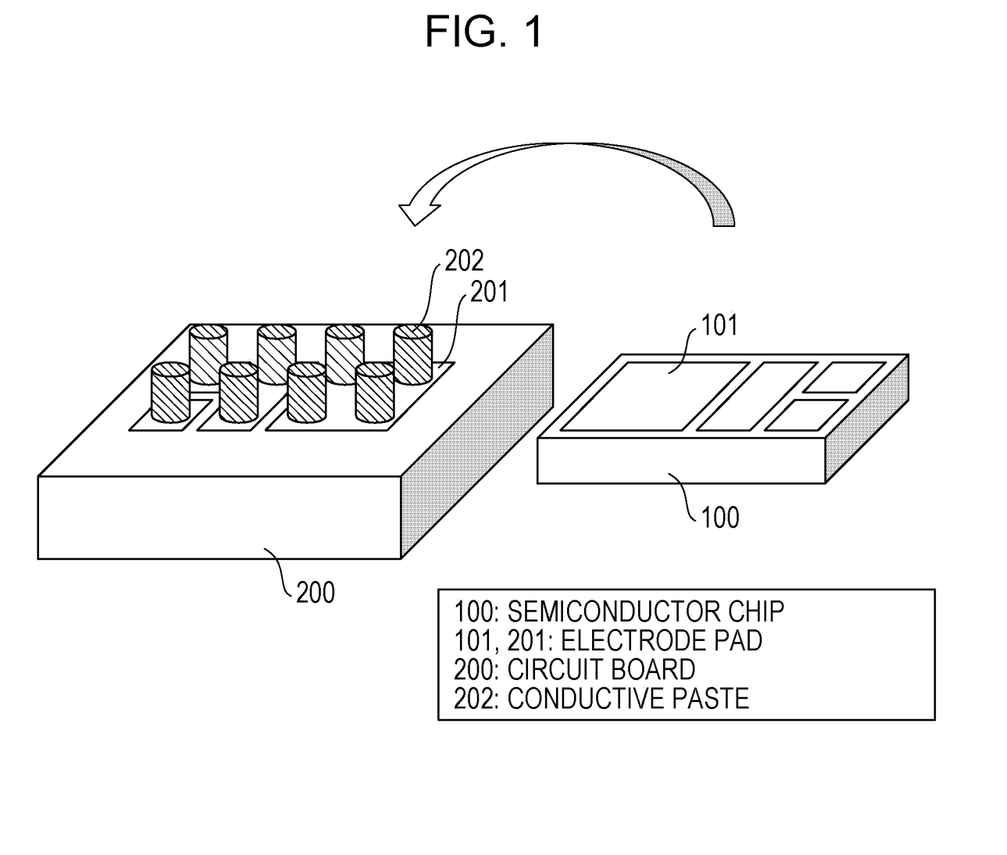
FIG. 1 is a perspective view showing structures of columns of a sintering-type silver paste, a circuit board, and a semiconductor chip according to Embodiment 1 of the present invention.

FIG. 1 is a perspective view showing structures of columns of a sintering-type silver paste, a circuit board, and a semiconductor chip according to Embodiment 1 of the present invention.

In FIG. 1, 100 denotes a semiconductor chip (device, electronic component), 101 denotes an electrode pad on the semiconductor chip, 200 denotes a circuit board (substrate), and 201 denotes an electrode pad on the circuit board 200. A conductive paste (conductive material) 202 is formed on the electrode pad 201 on the circuit board 200 by ejection from a dispenser. Thus, the columnar conductive paste 202 is stood on the electrode pad 201 on the circuit board 200.

In this experimental example, a sintering-type silver paste is used as the conductive paste 202. The sintering-type silver paste used as the conductive paste 202 contains flat silver particles having a thickness of 0.05 µm or more and 0.1 µm or less and a representative length of 5 µm or more and 10 µm or less, the representative length being a maximum diameter in a plane perpendicular to the thickness, ethylene glycol, and no adhesives. The weight percentage of ethylene glycol is 8% or more and 20% or less of the weight of the conductive paste 202.

In this state, the electrode pad 101 on the semiconductor chip 100 and the electrode pad 201 on the circuit board 200 are aligned with each other and further flip-chip bonded, thereby bringing the electrode pad 101 on the semiconductor chip 100 into contact with the top of the conductive paste 202 formed on the electrode pad 201 on the circuit board 200. Thus, the semiconductor chip 100 is mounted on the circuit board 200. In FIG. 1, the conductive paste 202 is drawn as having a cylindrical shape for brevity of the figure. Actually, however, a phenomenon called "stringing" occurs when the conductive paste 202 is dispensed. After the ejection is stopped, the conductive paste 202 is conically elongated under the influence of the viscosity of the material, the movement of a nozzle, and other factors and broken at a thinned portion. Therefore, the upper part of the conductive paste 202 is actually conical.

FIG. 2 shows an exemplary shape of a conductive paste formed by ejection from a dispenser. A "cylindrical" portion shown in FIG. 2, which is the lower part of the conductive paste 202, is a portion formed when the nozzle is raised at a constant speed while performing constant ejection from a dispenser. A "stringing" portion shown in FIG. 2, which is the upper part of the conductive paste 202, is a portion formed when the nozzle is raised after the ejection from the dispenser is stopped, i.e., a portion formed as a result of being conically shaped by the viscosity of the conductive paste 202, the nozzle speed, and other factors and broken at a thinned portion. The diameter of the base of the "stringing" portion is about 200 µm.

Figure 3:
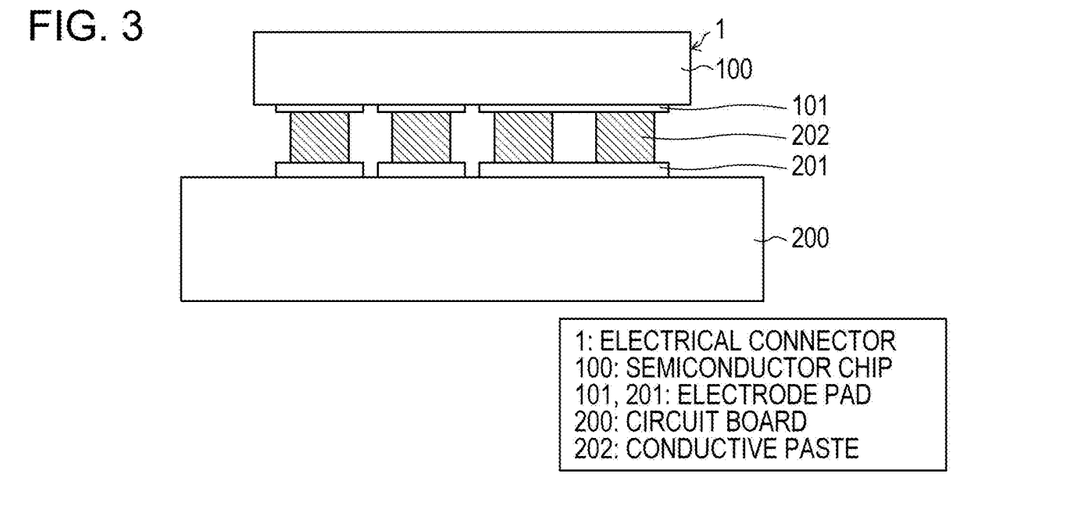
FIG. 3 is a sectional view showing a sintering-type silver paste connection portion according to Embodiment 1 of the present invention.

FIG. 3 is a sectional view of the circuit board 200 and the semiconductor chip 100 in connection with each other through the conductive paste 202.

As shown in FIG. 3, the electrode pad 201 on the circuit board 200 and the electrode pad 101 on the semiconductor chip 100 are aligned with each other. The semiconductor chip 100 is then flip-chip bonded to the circuit board 200, whereby the electrode pad 101 and the electrode pad 201 are electrically connected with each other through the conductive paste 202. As a result of this, an electrical connector (electrode connection structure) 1 is completed. Since the conductive paste 202 also has high thermal conductivity, the electrode pad 101 and the electrode pad 201 are connected with each other also in a thermal manner. That is, the conductive paste 202 functions as an electrical connection portion that electrically connects the electrode pad 101 and the electrode pad 201 with each other.

Figure 4:
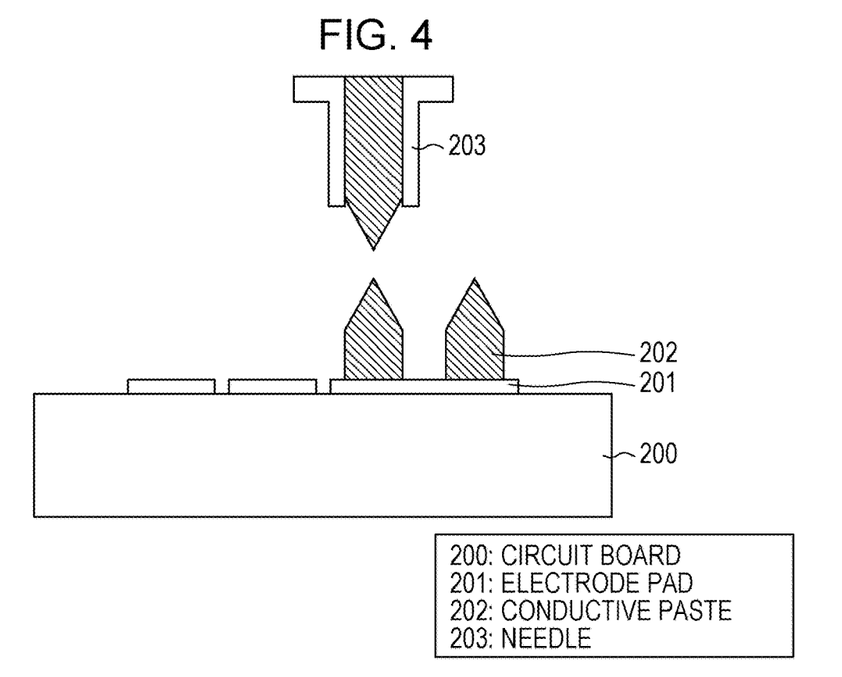
FIG. 4 illustrates a state in which the columns of the sintering-type silver paste according to Embodiment 1 of the present invention are ejected from a dispenser.

FIG. 4 shows an exemplary method of forming the conductive paste 202 on the electrode pad 201 on the circuit board 200.

As shown in FIG. 4, the conductive paste 202 is ejected from a needle 203 at the tip of a syringe (not shown) of a dispenser (not shown) to form the conductive paste 202 on the electrode pad 201 on the circuit board 200. In this experimental example, a dispenser manufactured by Musashi Engineering, Inc. is used. The needle 203 used is of the following types: (i) 100 µm in inner diameter-200 µm in outer diameter, (ii) 150 µm in inner diameter-250 µm in outer diameter, and (iii) 200 µm in inner diameter-300 µm in outer diameter.

Due to the properties of sintering-type silver paste, the shape of the conductive paste 202 ejected from the needle 203 of the dispenser remains the same. The conductive paste 202 ejected from the needle 203 of type (i) 100 µm in inner diameter, the conductive paste 202 ejected from the needle 203 of type (ii) 150 µm in inner diameter, and the conductive paste 202 ejected from the needle 203 of type 20 µm in inner diameter are formed into cylindrical shapes having a diameter in the range of 100 µm to 110 µm, a diameter of 150 µm to 165 µm, and a diameter of 200 µm to 220 µm, respectively.

The conductive pastes 202 ejected from the needles 203 of types (i) to (iii) are sintered as ejected. The diameter reduction of each conductive paste 202 is 10 µm or less. The conductive pastes 202 are sintered with their shape remaining the same.

The ejection of the sintering-type silver paste from the needle 203 is stopped at a desired level, and then the needle 203 is pulled up, whereby the sintering-type silver paste is naturally tapered and cut off. The upper part of the conductive paste 202 is formed into a cone called "stringing". The angle of the cone can be controlled by the viscosity of the sintering-type silver paste and the pull-up speed of the needle 203. The conical portion plays an important role to absorb uneven planarity, such as irregularities and undulations, of the surfaces of the semiconductor chip 100 and the circuit board 200 (particularly the circuit board 200) and uneven height of the conductive paste 202 formed.

After compressed air for ejection is released at the needle 203, the needle 203 is raised at 5 mm/min, and the "stringing" portion is finished to a conical shape with a tip angle of 30°. When the needle 203 is raised at 10 mm/min, the tip angle of the "stringing" portion is changed to 10°. Although the tip angle of the "stringing" portion varies depending on the rise rate of the needle 203, final angles are stable.

Figure 5:
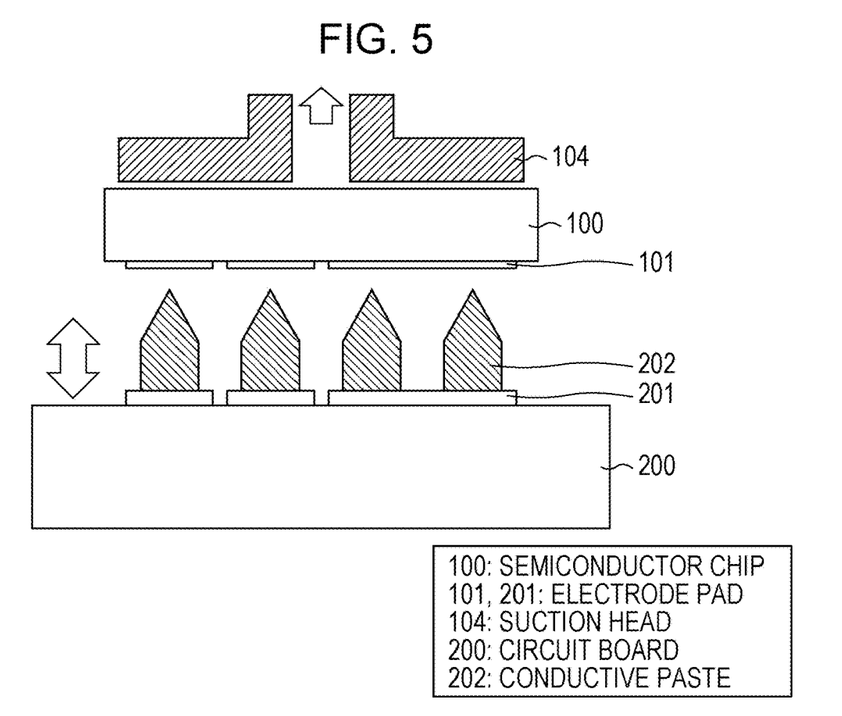
FIG. 5 illustrates a state in which the semiconductor chip is fixed by suction to a flip-chip bonder according to Embodiment 1 of the present invention.

FIG. 5 shows a state in which the semiconductor chip 100 is fixed by suction to a suction head 104 of a flip-chip bonder (not shown) and the electrode pad 101 and the electrode pad 201 are aligned with each other. By vacuum suction through a suction hole in the suction head 104, the semiconductor chip 100 is fixed to the suction head 104. Thereafter, the electrode pad 101 and the electrode pad 201 are aligned with each other using the mechanism of the flip-chip bonder.

The flip-chip bonder used is manufactured by Okuhara Electric Co., Ltd. Using a flat collet having a vacuum suction hole with a diameter of 1 mm in the center and having a slightly larger size than that of the semiconductor chip 100, the semiconductor chip 100 is fixed by suction to the flat collet. Thereafter, the electrode pad 101 on the semiconductor chip 100 and the electrode pad 201 on the circuit board 200 are recognized with a camera mounted on the flip-chip bonder and aligned with each other, and the semiconductor chip 100 is moved toward the circuit board 200.

Figure 6:
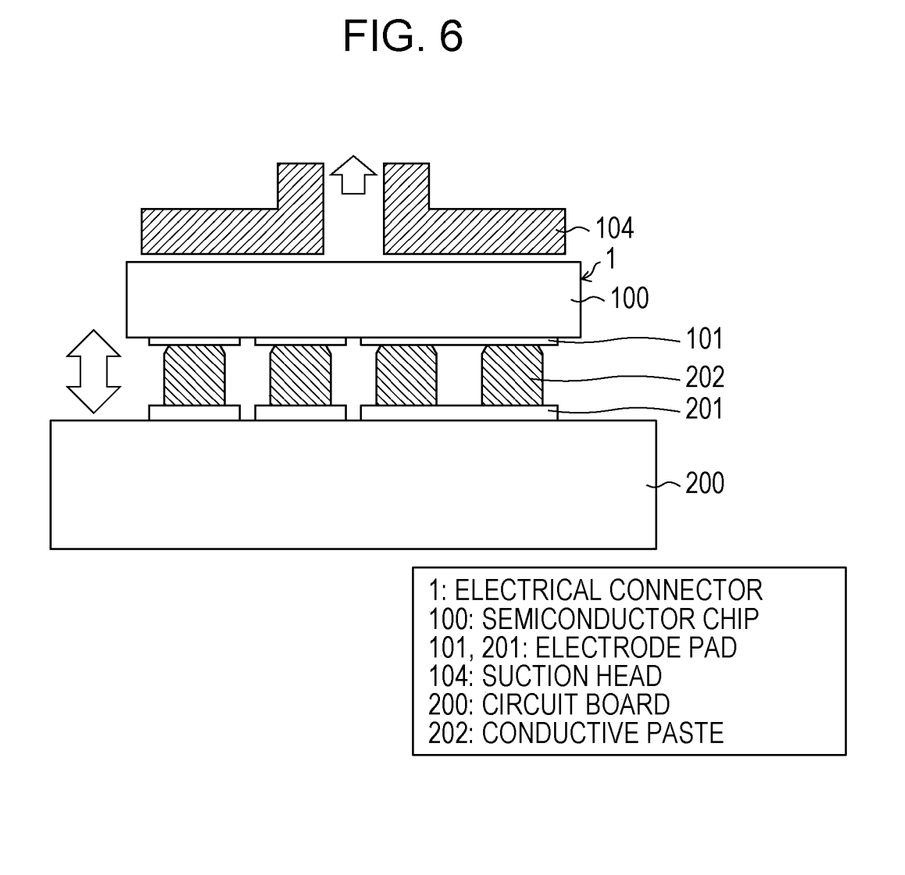
FIG. 6 illustrates a state in which flip-chip bonding is performed with the columns of the sintering-type silver paste according to Embodiment 1 of the present invention.

FIG. 6 shows a state in which the semiconductor chip 100 is lowered toward the circuit board 200 with the suction head 104 of a flip-chip bonder (not shown) to bring the electrode pad 101 and the conductive paste 202 into contact with each other. The flip-chip bonder has a function to move the suction head 104 based on reaction force information. This function enables positioning to be performed in such a manner that the electrode pad 101 and the conductive paste 202 are brought into contact with each other while collapsing the conical portion of the "stringing" portion of the conductive paste 202, and the electrode pad 101 is relatively moved in a direction toward the electrode pad 201 with the cylindrical portion of the conductive paste 202 left uncollapsed. Thereafter, the vacuum suction by the suction head 104 is released to separate the suction head 104 from the semiconductor chip 100 having the electrode pad 101, as a result of which the electrode pad 101 comes into contact with the conductive paste 202 on the electrode pad 201 on the circuit board 200. The load (reaction force) at this time is as shown in FIG. 11. Details will be given later.

As shown in FIG. 6, upon contact of the electrode pad 101 with the "stringing" portion, serving as a connection portion, of the conductive paste 202, the reaction force gradually increases, after which the increase of the reaction force slows down once, and then the reaction force starts to increase.

The suction head 104 is stopped when the reaction force reaches a value at which the reaction force starts to increase again, and the semiconductor chip 100 is released from the suction head 104. Thereafter, the entire system is heated with the electrode pad 101 kept in contact with the conductive paste 202 by the self-weight of the semiconductor chip 100, thereby baking the conductive paste 202. Thus, the connection between the conductive paste 202 and the electrode pad 101 is completed.

The semiconductor chip 100 need not be pressed during baking because the shape of the conductive paste 202 is retained due to dilatancy.

The curing of the conductive paste 202 is performed as follows: first, to volatilize the solvent of the conductive paste 202, the temperature is maintained at a temperature 5° C. to 10° C. lower than the boiling point of the solvent, then raised to a temperature for sintering the silver paste and maintained to complete the sintering, and returned to normal temperature. For example, as the boiling point of the solvent is 197° C., the temperature is maintained at 190° C. for 15 minutes, then raised to a sintering temperature 250° C., and maintained for 30 minutes, thereby completing the sintering. Thus, the electrical connector 1 is completed.

As described above, since the conductive paste 202 is a sintering-type silver paste having shape retention properties, the conductive paste 202 that is a self-standing columnar protruding electrode not extending along the circuit board 200 or the semiconductor chip 100 is successfully formed. Furthermore, the sintering-type silver paste, i.e., the conductive paste 202 contains no adhesives and is constituted by sintered silver paste alone, and thus is excellent both in electrical conductivity and thermal conductivity and retains its mechanical properties at high temperatures.

The columnar conductive pastes 202 constituting the connection portions described above have horizontal sections (sections taken in a direction perpendicular to the direction in which the conductive pastes 202 are stretched) having substantially the same shape and have a variation in sectional area of 20% or less.

Figure 7:
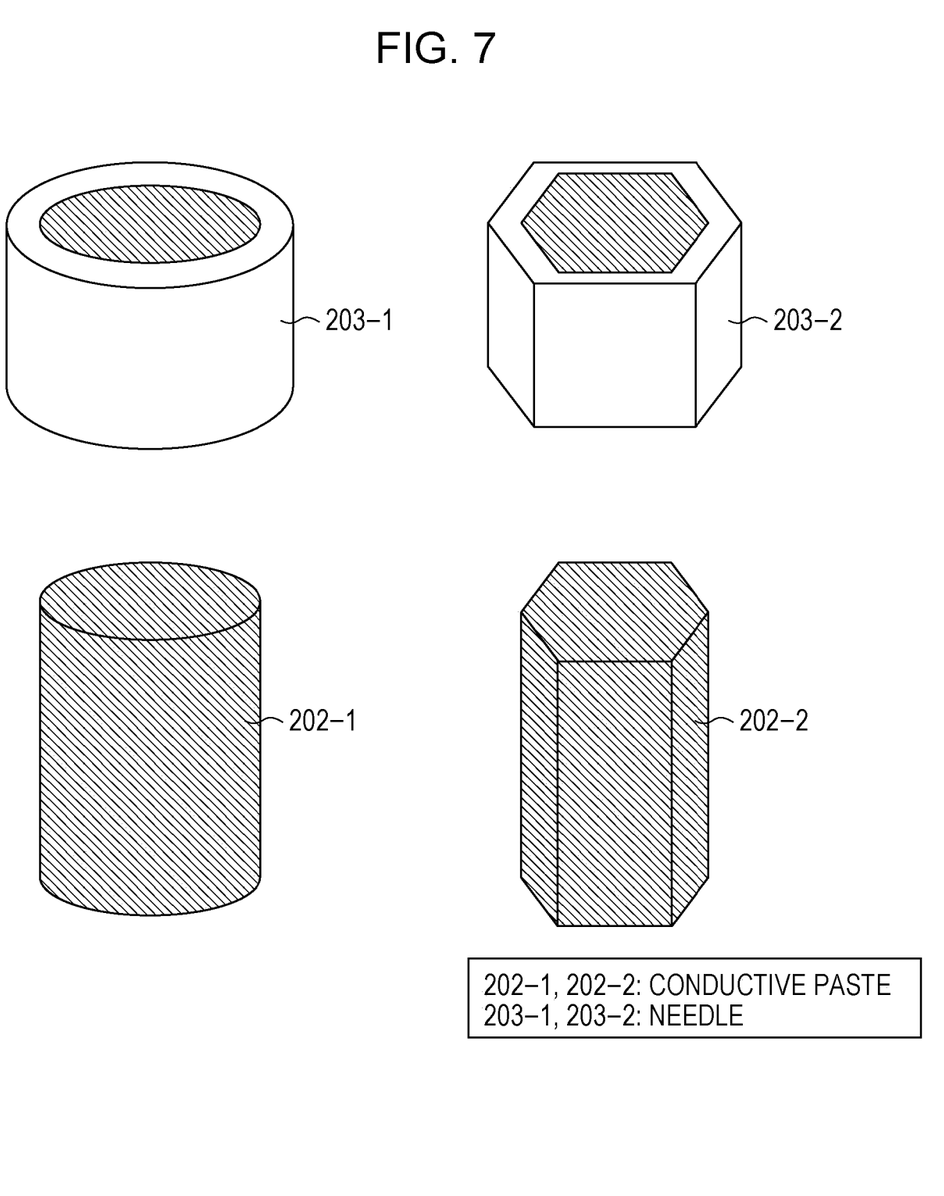
FIG. 7 illustrates the shapes of sintering-type silver pastes according to Embodiment 1 of the present invention ejected from a dispenser.

FIG. 7 shows shapes of the needles 203 for dispensing and shapes of the conductive pastes 202 ejected. 203-1 is a ring-shaped needle. When ejected from the ring-shaped needle 203-1, the conductive paste is formed into a cylindrical shape as shown by a conductive paste 202-1. 203-2 is an example of a hexagonal needle. When ejected from the hexagonal needle 203-2, the conductive paste is formed into a hexagonal shape as shown by a conductive paste 202-2. The ejection from the hexagonal needle 203-2 caused inside corners, but there are no problems because they are at 120°. In the case of a quadrangular needle, the inside corners are at 90°, and thus the ejection at the corners is not smooth. Rounding the corners into an arc larger than the representative length of conductive particles of the conductive paste 202 enables successful ejection. Specifically, the corners are rounded to 16 µm, which is twice the maximum representative length 8 µm of silver particles. Preferably, rounding to 40 µm, i.e., five times, or more provides higher stability.

Embodiment 2

Figure 8:
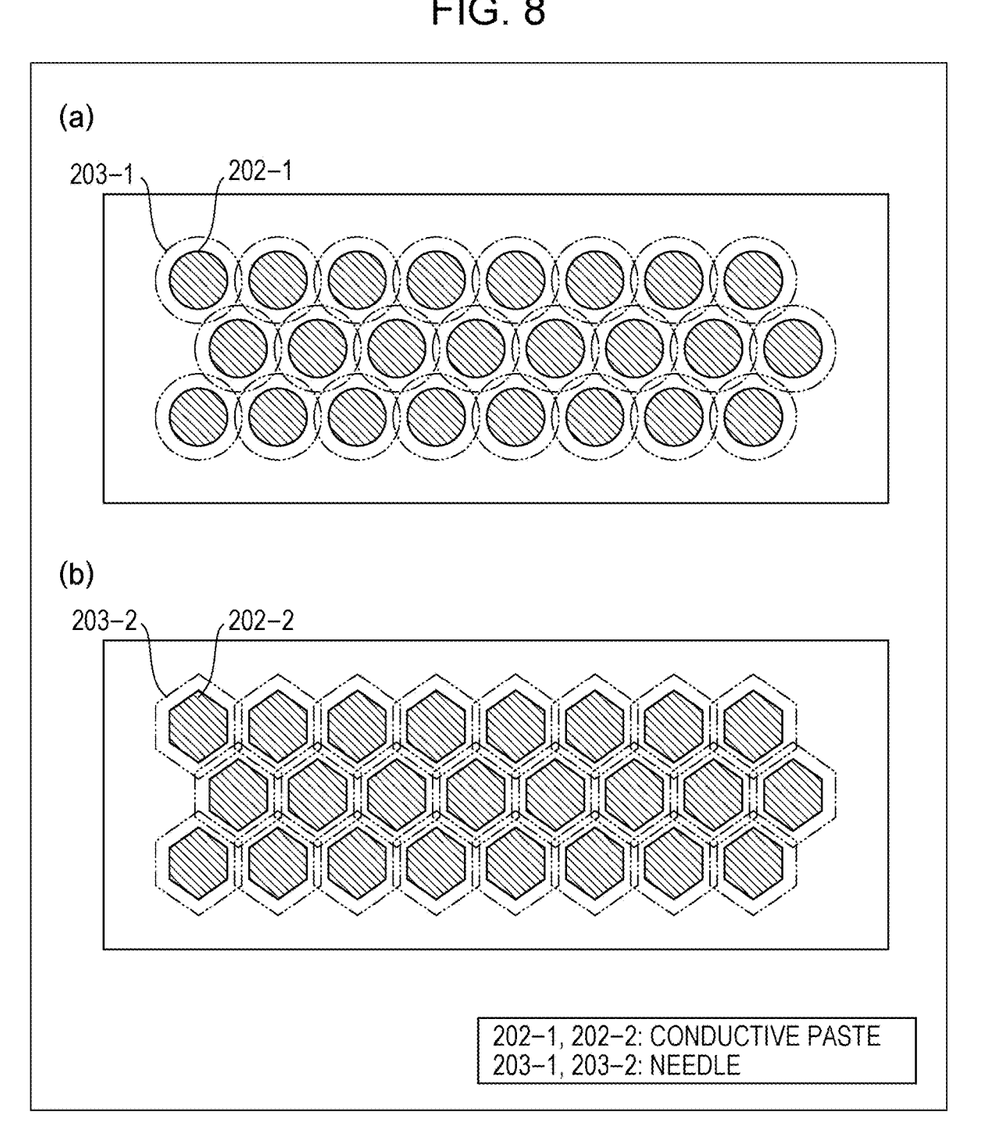
FIG. 8 illustrates an array arrangement of the columns of the sintering-type silver paste according to Embodiment 2 of the present invention.

FIG. 8 shows examples of arrangements of needles in arrays. FIG. 8(a) shows an example of an arrangement of the ring-shaped needles 203-1 in an array, and FIG. 8(b) shows an example of an arrangement of the hexagonal needles 203-2 in an array.

On a large-area electrode, needles are arranged in an array. The examples in FIG. 8 are hexagonal close-packed arrangements which provide the highest density on electrodes.

The two-dot chain line in FIG. 8 conceptually indicates the nozzle size of a dispenser, and the arrangements are possible if the pitch is determined taking into consideration the nozzle size and the alignment accuracy of the dispenser.

This increases the sectional area that functions as an electrode, leading to lower connection resistance. At the same time, the surface area of the connection portion is increased, and binder volatilization of the sintering-type silver paste can be smoothly performed, thus enabling sintering to be performed in a short time.

For example, to connect a sintering-type silver paste with the entire surface of an electrode of 1 mm×0.5 mm by using the needles 203-1 or 203-2 not in an array as shown in FIG. 8(a) or 8(b), it was necessary to perform preheating for 30 minutes, volatilize a binder, and then perform sintering for 30 minutes. However, by arranging the needles 203-1 or 203-2 in an array as shown in FIG. 8(a) or 8(b), sufficient sintering was achieved even when the preheating time was shortened from 30 minutes to 5 minutes.

Arranging the needles 203-1 or 203-2 in an array inn the above manner further ensured that the plurality of columnar conductive pastes 202 had horizontal sections having substantially the same shape and had a variation in sectional area of 20% or less.

Embodiment 3

Figure 9:
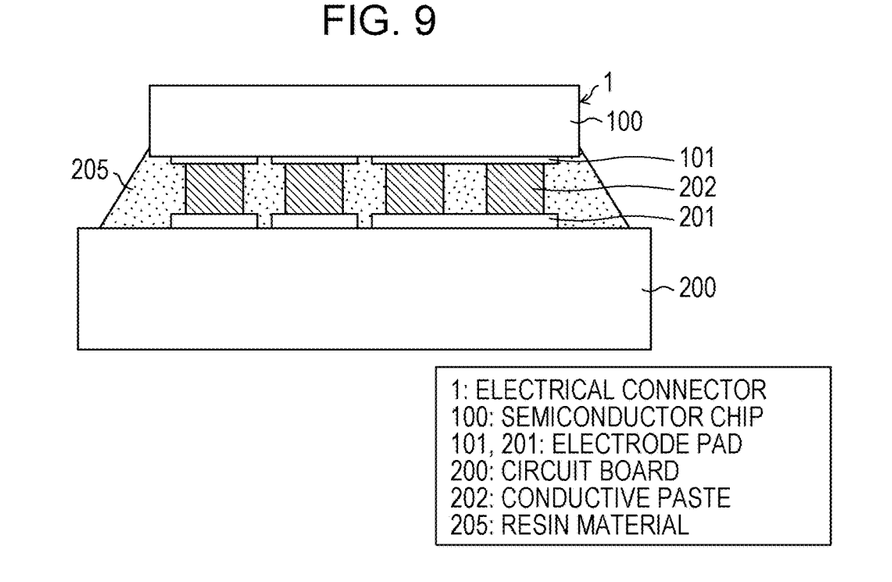
FIG. 9 shows a state in which the vicinity of connection portions of an electrical connector according to Embodiment 3 of the present invention is filled with a resin.

FIG. 9 is a sectional view showing a state in which after the electrode pad 101 and the electrode pad 201 are connected to each other through the conductive paste 202, a region between the electrode pad 101 and the electrode pad 201 other than the connection portions, i.e., the plurality of conductive pastes 202 is filled with a resin material 205.

Regarding electrical conductivity and thermal conductivity, sintering-type silver paste exhibits properties similar to those of bulk silver, but because of being a sintered body, its mechanical properties, in particular, ductility, are not as good as the properties of metals. Thus, the resistance to repeated loading of the connection portions was not as good as those of metal joints. However, in the first connection and the subsequent temperature history such as several repairs, there were no problems with connection, and thus a region other than the sintering-type silver paste connection portions was filled with the resin material 205 after the final operation check, as a result of which the reliability of the connection portions was improved to a level sufficient for a module. The resin material 205 used for filling may be, for example, a liquid epoxy. When a material having a Young's modulus lower than that of bulk silver and a coefficient of thermal expansion similar to that of bulk silver was used, the reliability was best improved.

Embodiment 4

Figure 10:
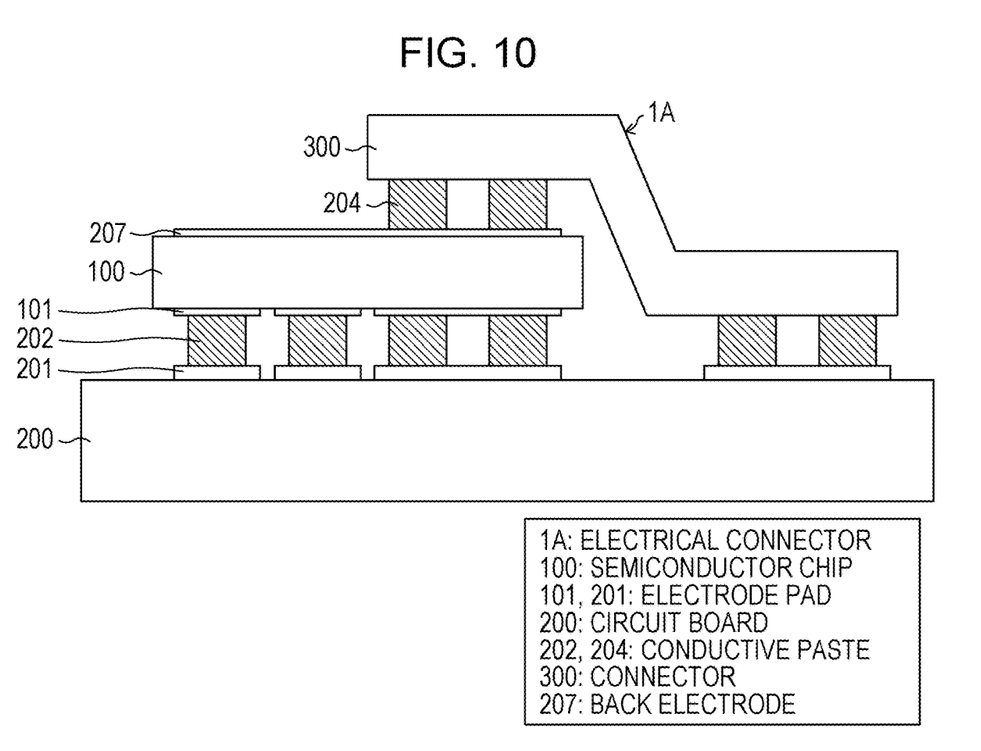
FIG. 10 shows a state in which an electrode on the back surface of a chip of an electrical connector is also connected using the sintering-type silver paste according to Embodiment 4 of the present invention.

FIG. 10 is a sectional view showing a state in which a connector (second substrate) 300 that connects a back electrode 207 on the semiconductor chip 100 and the electrode pad 201 on the circuit board 200 with each other is bonded with connection portions formed of a plurality of conductive pastes (second conductive materials) 204, for example, in the case of a device that requires back contact. The material of the conductive pastes 204 was the same as that of the conductive pastes 202.

The conductive pastes 202 are bonded to 101 on the surface of the semiconductor chip 100 and sintered, after which the conductive pastes 204 are formed on the back electrode 207 with a dispenser, and at the same time, the conductive pastes 202 are formed also on a desired electrode pad 201 on the circuit board 200. Thus, the plurality of columnar conductive pastes 204 were stood on the back electrode 207, and the plurality of columnar conductive pastes 202 were stood on the electrode pad 201.

Thereafter, the connector 300 is fixed by suction to a flip-chip bonder and pushed down to bond the connector 300 to the conductive pastes 204 on the back surface of the semiconductor chip 100 and to the conductive pastes 202 on the electrode pad on the circuit board 200, and the conductive pastes 204 and 202 are sintered. In this sintering, the state of the conductive pastes 202 that have already been sintered and are in contact with the electrode pad 101 on the front surface of the semiconductor chip 100 undergoes no change due to the properties of sintering-type silver paste.

In this case, the connection portions formed of the conductive pastes 202 and 204 on the front surface and the back surface of the semiconductor chip 100 can be simultaneously sintered.

First, all the conductive pastes 202 are formed on the electrode pads 201 on the circuit board 200.

Next, the semiconductor chip 100 is mounted with a flip-chip bonder, and the conductive pastes 204 are dispensed onto the back surface of the semiconductor chip 100. Subsequently, the connector 300 is mounted with a flip-chip bonder, and then all the conductive pastes 202 and 204 are baked. Due to the shape retention properties of the sintering-type silver paste connection portions, the connection portions (the conductive pastes 202) on the front-surface side of the semiconductor chip 100 retain their shape during the mounting of the connector 300 with a flip-chip bonder. Due to these properties, simultaneous bonding on the front and back can be performed. In this manner, a stack-bonded electrical connector (electrode connection structure was completed.

Embodiment 5

FIG. 11 is a graph showing how the reaction force of the conductive pastes 202 and 204 changes when the semiconductor chip 100 fixed by suction to a flip-chip bonder is pushed down toward the circuit board 200. The amount of chip movement of the bonder and the reaction force are plotted.

As shown in FIG. 11, the timing for pushing the semiconductor chip 100 and the connector 300 is controlled while monitoring the reaction force of the conductive pastes 202 and 204.

When the semiconductor chip 100 is pushed down, reaction force is not generated until electrodes on the chip come into contact with "stringing" tips of the sintering-type silver pastes. The "stringing" tips and the electrodes on the chip come into contact with each other at point A, and reaction force gradually increases. When point 13 is reached, the stringing portions are all collapsed, and the increase in sectional area stops. Thus, the increase in reaction force slows down at a moving speed at which dilatancy is not manifested. The pushing down continued, and the reaction force starts to increase at point C. This is probably because the reaction force is increased as a result of a manifestation of dilatancy of the material.

This behavior of the reaction force shows that when flip-chip bonding is performed, controlling so as to stop at a reaction force value at which the reaction force is increased by dilatancy enables stable bonding. The bonding height can be controlled by the amount of sintering-type silver paste ejected.

[Conclusions]

The conductive paste 202 according to Aspect 1 of the present invention is usable for electrical connection between a substrate (circuit board 200) and an electronic component (semiconductor chip 100) mounted on the substrate (circuit board 200). The conductive paste 202 contains a conductive powder, an alcoholic liquid component, and no adhesives. The conductive powder contains conductive particles having a thickness of 0.05 μm or more and 0.1 μm or less and a representative length of 5 μm or more and 10 μm or less, the representative length being a maximum diameter in a plane perpendicular to a direction of the thickness. The weight percentage of the alcoholic liquid component in the conductive paste 202 is 8% or more and 20% or less.

According to the above configuration, a conductive material that is a sintering-type silver paste having shape retention properties can be provided. Thus, an electrode like a protruding electrode that stands on the above substrate by itself can be formed from the above conductive material. Furthermore, the sintering-type silver paste formed from the above conductive material contains no adhesives and is constituted by sintered silver paste alone, and thus is excellent in both electrical conductivity and thermal conductivity and retains its mechanical properties at high temperatures.

The electrical connection structure (electrical connector 1) according to Aspect 2 of the present invention is an electrode connection structure (electrical connector 1) in which the conductive paste 202 according to Aspect 1 is used for electrical connection portions (connection portions) that connect the electrode pad 201 on the substrate (circuit board 200) and the electrode pad 101 on the electronic component (semiconductor chip 100) to each other. The electrical connection portions obtained by curing the conductive paste that connects the electrode pad 201 on the substrate (circuit board 200) and the electrode pad 101 on the electronic component (semiconductor chip 100) to each other may have sections having substantially the same shape, the sections being taken in a direction perpendicular to a direction in which the electrode pad 201 on the substrate (circuit board 200) and the electronic component (semiconductor chip 100) are connected to each other, and may have a variation in sectional area of 20% or less.

A method for producing an electrode connection structure (electrical connector 1) according to Aspect 3 of the present invention is a method for producing the electrode connection structure according to Aspect 2. The method may include a step of forming a protruding electrode on the electrode pad 201 on the substrate (circuit board 200) with the conductive paste 202; a step of bringing the electrode pad 101 on the electronic component (semiconductor chip 100) into contact with the protruding electrode on the electrode pad 201 on the substrate (circuit board 200), relatively moving the electrode pad 101 on the electronic component (semiconductor chip 100) at a constant speed in a direction toward the electrode pad 201 on the substrate (circuit board 200), and stopping the relative movement of the electrode pad 101 on the electronic component (semiconductor chip 100) when a predetermined reaction force is received from the protruding electrode; and a step of connecting the electrode pad 201 on the substrate (circuit board 200) and the electrode pad 101 on the electronic component (semiconductor chip 100) to each other by curing the protruding electrode after stopping the movement of the electrode pad 101 on the electronic component (semiconductor chip 100).

The present invention is not limited to the foregoing embodiments; various modifications can be made within the scope of the claims, and embodiments having suitable combinations of technical means disclosed in different embodiments are also included in the technical scope of the invention. Furthermore, novel technical features can be provided by combining technical means disclosed in the embodiments.

REFERENCE SIGNS LIST 1, 1A electrical connector (electrode connection structure)
100 semiconductor chip (device, electronic component)
101, 201 electrode pad
104 suction head
200 circuit board (substrate)
202 conductive paste (protruding electrode)
203 needle
204 conductive paste (protruding electrode)
205 resin material
207 back electrode
300 connector (second substrate)

The invention claimed is:

1. A conductive paste usable for electrical connection between a substrate and an electronic component mounted on the substrate,
the conductive paste comprising a conductive powder and an alcoholic liquid component, the conductive paste containing no adhesives,
wherein the conductive powder contains conductive particles having a thickness of 0.05 μm or more and 0.1 μm or less and a representative length of 5 μm or more and 10 μm or less, the representative length being a maximum diameter in a plane perpendicular to a direction of the thickness, and
a weight percentage of the alcoholic liquid component in the conductive paste is 8% or more and 20% or less.

2. An electrode connection structure, wherein the conductive paste according to claim 1 is used for electrical connection portions that connect an electrode pad on the substrate and an electrode pad on the electronic component to each other, and
the electrical connection portions obtained by curing the conductive paste that connects the electrode pad on the substrate and the electrode pad on the electronic component to each other have sections having substantially the same shape, the sections being taken in a direction perpendicular to a direction in which the electrode pad on the substrate and the electronic component are connected to each other, and have a variation in sectional area of 20% or less.

3. A method for producing the electrode connection structure according to claim 2, the method comprising the steps of:
forming a protruding electrode on the electrode pad on the substrate with the conductive paste;
bringing the electrode pad on the electronic component into contact with the protruding electrode on the electrode pad on the substrate, relatively moving the electrode pad on the electronic component at a constant speed in a direction toward the electrode pad on the substrate, and stopping the relative movement of the electrode pad on the electronic component when a predetermined reaction force is received from the protruding electrode; and
connecting the electrode pad on the substrate and the electrode pad on the electronic component to each other by curing the protruding electrode after stopping the movement of the electrode pad on the electronic component.

* * * * *